US009460923B2

(12) United States Patent
Halimaoui et al.

(10) Patent No.: US 9,460,923 B2
(45) Date of Patent: Oct. 4, 2016

(54) METHOD OF FORMING A STRAINED SILICON LAYER

(71) Applicants: STMicroelectronics (Crolles 2) SAS, Crolles (FR); Commissariat à l'Énergie Atomique et aux Énergies Alternatives, Paris (FR)

(72) Inventors: Aomar Halimaoui, La Terrasse (FR); Jean-Michel Hartmann, Meylan (FR)

(73) Assignees: STMicroelectronics (Crolles 2) SAS, Crolles (FR); Commisariat A L'Energie Atomique et aux Energies Alternatives, Paris (FR)

( * ) Notice: Subject to any disclaimer, the term of this patent is extended or adjusted under 35 U.S.C. 154(b) by 114 days.

(21) Appl. No.: 14/220,406

(22) Filed: Mar. 20, 2014

(65) Prior Publication Data

US 2014/0284769 A1   Sep. 25, 2014

(30) Foreign Application Priority Data

Mar. 20, 2013 (FR) ...................... 13/52497

(51) Int. Cl.
*H01L 21/02* (2006.01)
*H01L 29/10* (2006.01)
*H01L 21/8238* (2006.01)
*H01L 21/84* (2006.01)

(52) U.S. Cl.
CPC ... *H01L 21/02694* (2013.01); *H01L 21/02002* (2013.01); *H01L 21/0245* (2013.01); *H01L 21/02381* (2013.01); *H01L 21/02502* (2013.01); *H01L 21/02532* (2013.01); *H01L 29/1054* (2013.01); *H01L 21/823807* (2013.01); *H01L 21/84* (2013.01)

(58) Field of Classification Search
CPC ............... H01L 27/1203; H01L 21/02532; H01L 21/324; H01L 21/02667; H01L 29/7842; H01L 21/02694; H01L 21/7624
See application file for complete search history.

(56) References Cited

U.S. PATENT DOCUMENTS

| | | | |
|---|---|---|---|
| 6,972,247 B2 * | 12/2005 | Bedell | H01L 21/324 257/E21.324 |
| 7,416,957 B2 * | 8/2008 | Ponomarev | H01L 21/02381 257/347 |
| 7,524,740 B1 * | 4/2009 | Liu | H01L 21/02532 438/479 |
| 2004/0142541 A1 | 7/2004 | Cohen et al. | |

(Continued)

FOREIGN PATENT DOCUMENTS

WO   WO 2005/059979   6/2005

OTHER PUBLICATIONS

French Search Report and Written Opinion dated Jul. 22, 2013 from corresponding French Application No. 13/52497.

*Primary Examiner* — Bac Au
(74) *Attorney, Agent, or Firm* — Gardere Wynne Sewell LLP

(57) ABSTRACT

The present disclosure concerns a method involving: forming a strained silicon germanium layer by epitaxial growth over a silicon layer disposed on a substrate; implanting atoms to amorphize the silicon layer and a lower portion of the silicon germanium layer, without amorphizing a surface portion of the silicon germanium layer; and annealing, to at least partially relax the silicon germanium layer and to re-crystallize the lower portion of the silicon germanium layer and the silicon layer, so that the silicon layer becomes a strained silicon layer.

14 Claims, 3 Drawing Sheets

(56) References Cited

U.S. PATENT DOCUMENTS

| | | |
|---|---|---|
| 2006/0211221 A1 | 9/2006 | Mantl et al. |
| 2006/0214257 A1* | 9/2006 | Ninomiya ......... H01L 21/26506 257/502 |
| 2007/0026650 A1* | 2/2007 | Hebras .............. H01L 21/76254 438/514 |
| 2008/0171423 A1* | 7/2008 | Ieong ................ H01L 21/02658 438/486 |

* cited by examiner

METHOD OF FORMING A STRAINED SILICON LAYER

CROSS REFERENCE TO RELATED APPLICATIONS

This application claims the priority benefit of French Patent Application No. 13/52497, filed on Mar. 20, 2013, entitled "Method of Forming a Strained Silicon Layer," which is hereby incorporated by reference to the maximum extent allowable by law.

BACKGROUND

1. Technical Field

The present disclosure relates to the field of silicon on insulator (SOI) structures, and in particular to a method of forming a strained silicon layer.

2. Discussion of the Related Art

In certain applications, such as for the formation of high performance transistors, it can be advantageous to use a strained silicon or silicon germanium layer. In particular, silicon layers that are in tension and/or compression demonstrate an increased speed of charge careers, thereby increasing performance of transistor devices formed within such layers.

Existing techniques for forming a strained silicon layer generally involve forming the silicon layer by epitaxial growth over a relaxed silicon germanium (SiGe) layer. Thus the silicon atoms are stretched beyond their normal interatomic distance by the SiGe seed layer, resulting in a strained silicon layer.

A problem with such existing techniques is that there tends to be a relatively high density of defects in the relaxed SiGe layer, which are then transferred to the epitaxial silicon layer.

There is thus a need in the art for an improved method of forming a strained silicon layer.

SUMMARY

It is an aim of embodiments of the present disclosure to at least partially address one or more problems in the prior art.

According to one aspect, there is provided a method comprising: forming a strained silicon germanium layer by epitaxial growth over a silicon layer disposed on a substrate; implanting atoms to amorphize the silicon layer and a lower portion of the silicon germanium layer, without amorphizing a surface portion of the silicon germanium layer; and annealing, to at least partially relax the silicon germanium layer and to re-crystallize the lower portion of the silicon germanium layer and the silicon layer, whereby the silicon layer becomes a strained silicon layer.

According to one embodiment, the silicon layer is formed over an amorphous layer disposed on the substrate, and the amorphous layer is for example an oxide layer formed over the substrate.

According to one embodiment, during the implantation step, atoms are implanted to a maximum depth falling within the amorphous layer or within the substrate.

According to one embodiment, the implantation of atoms during the implantation step is localized using a mask.

According to one embodiment, the silicon germanium layer has a thickness of between 20 and 200 nm.

According to one embodiment, the silicon germanium layer has a thickness lower than the critical thickness below which SiGe grows, without defect, with the lattice parameter of the underlying silicon layer.

According to one embodiment, the silicon germanium layer has a germanium concentration of between 10 and 50 percent.

According to one embodiment, the surface portion has a thickness of at least 1 nm.

According to one embodiment, the annealing is performed at a temperature of between 500 and 1100° C., and the annealing for example comprises laser or lamp annealing to superficially heat the silicon germanium layer.

According to one embodiment, the annealing comprises a first anneal of between 300 and 500° C. followed by a second anneal at a temperature greater than 500° C.

According to one embodiment, the method further comprises, after the annealing step, etching to at least partially remove the silicon germanium layer.

According to one embodiment, the method further comprises the epitaxial growth of another layer on the silicon germanium layer.

According to one embodiment, the implanted atoms are atoms of argon.

According to a further aspect, there is provided a device comprising a layer of stressed silicon disposed on a substrate, wherein the stressed silicon layer has a compressive or tensile stress level of at least 800 MPa and a maximum dislocation density of $10^4/cm^2$.

According to one embodiment, the device comprises a layer of silicon germanium disposed over a portion of the stressed silicon layer.

BRIEF DESCRIPTION OF THE DRAWINGS

The foregoing and other features and advantages will become apparent from the following detailed description of embodiments, given by way of illustration and not limitation with reference to the accompanying drawings, in which.

Figure 1A:
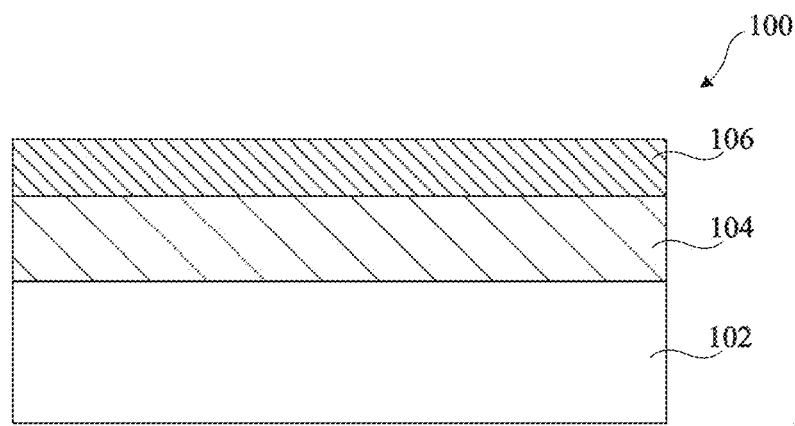
FIGS. 1A to 1C are cross-section views of a silicon structure illustrating steps in a method that has been proposed for forming a strained silicon layer.

As is customary in the representation of silicon-based structures, the various cross-sectional views are not drawn to scale. Furthermore, throughout the following description, terms depending on orientation of the structure, such as lower, upper, up and down, are assumed to apply when the structure is oriented as depicted in the drawings.

DETAILED DESCRIPTION

Figure 1B:
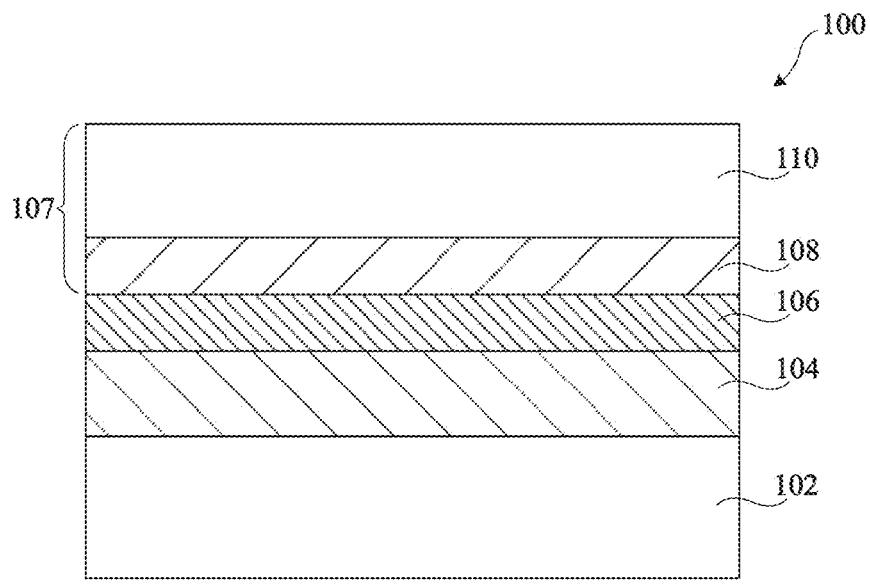
Figure 1C:
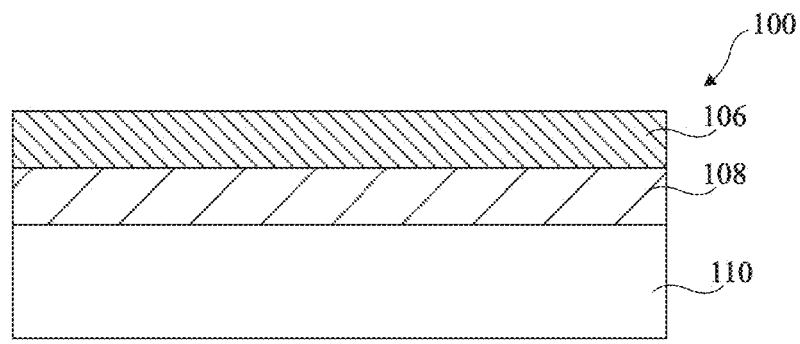

FIGS. 1A to 1C are cross-section views of a structure during successive steps in a method for forming a strained silicon layer.

FIG. 1A illustrates a structure 100 comprising a silicon substrate 102. A relaxed silicon germanium (SiGe) layer 104 has been formed by epitaxial growth over the silicon substrate 102. SiGe layer 104 for example comprises lower concentrations of germanium near the interface with the silicon substrate 102, and higher concentrations of germanium towards its upper surface. A silicon layer 106 has been formed by epitaxial growth over the SiGe layer 104, resulting in a strained silicon layer as the silicon atoms are stretched beyond their normal inter-atomic distance by the presence of the underlying SiGe layer 104.

FIG. 1B illustrates the silicon structure 100 after a subsequent step in which an oxidized silicon support substrate 107, comprising an oxide layer 108 and a silicon substrate 110, is bonded to the strained silicon layer 106.

FIG. 1C illustrates the silicon structure 100 after a subsequent step in which grinding or splitting is performed to remove the silicon substrate 102, and CMP (chemical-mechanical polishing) and/or selective etching of SiGe is performed to remove the SiGe layer 104. This results in an SOI (silicon on insulator) structure comprising the strained silicon layer 106 bonded to the support substrate 110 by the oxide layer 108.

A drawback of the process of FIGS. 1A to 1C is that a relatively high density of defects can be observed in the SiGe layer 104. Indeed, even if the concentration of germanium in the SiGe layer 104 is progressively increased from 0 to a value typically of between 10% and 50% from the interface with the substrate 102 up to the surface of the SiGe layer, the dislocation density remains at a level of around $10^5$ per $cm^2$ in the top portion of the SiGe layer 104. Such defects are transferred to the epitaxial silicon layer 106. Furthermore, a cross-hatch pattern is often observed on the surface of the SiGe layer 104, which is removed using a chemical mechanical polishing step prior to forming the silicon layer 106.

FIGS. 2A to 2E are cross-section views illustrating a structure 200 during successive steps of a method for forming a strained silicon layer according to an example embodiment.

Figure 2A:
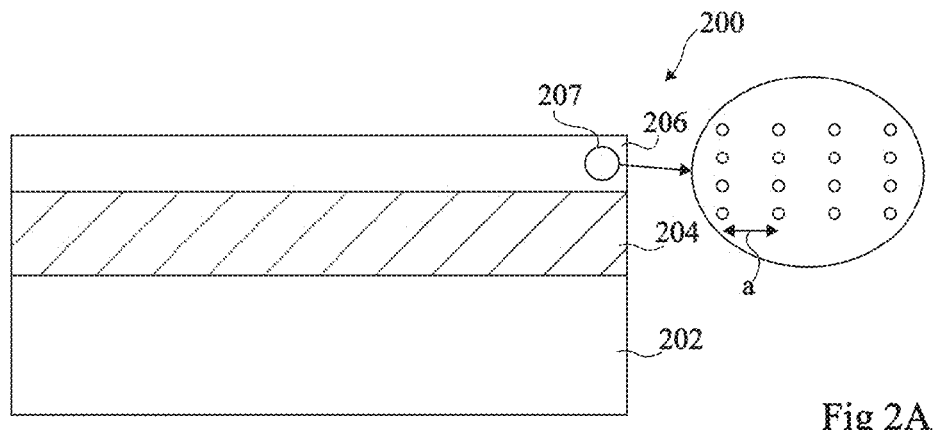
FIGS. 2A to 2E are cross-section views of a silicon structure illustrating steps in a method of forming a strained silicon layer according to an example embodiment of the present disclosure.

FIG. 2A is a first view of the structure 200, which is, for example, a silicon on insulator (SOI) structure comprising a silicon substrate 202, having an insulating layer 204, for example of $SiO_2$, and a silicon layer 206 formed over the oxide layer 204. The thickness of the silicon layer 206 is, for example, in the range of 4 to 60 nm, and typically in the range of 5 to 20 nm, for example around 10 nm. The thickness of the oxide layer 204 is typically between 10 and 200 nm, for example of 145 nm.

To aid an understanding of the atomic structures of the various silicon and SiGe layers, the arrangement of atoms has been represented very schematically in FIGS. 2A to 2E. Of course, such simplistic representations are not intended to illustrate with any accuracy the actual arrangement of atoms in the silicon structure. In FIG. 2A, a zone 207 of the silicon layer 206 is represented, and shown to have a uniform mono-crystalline structure, with atoms regularly spaced apart by an inter-atomic distance a.

Figure 2B:
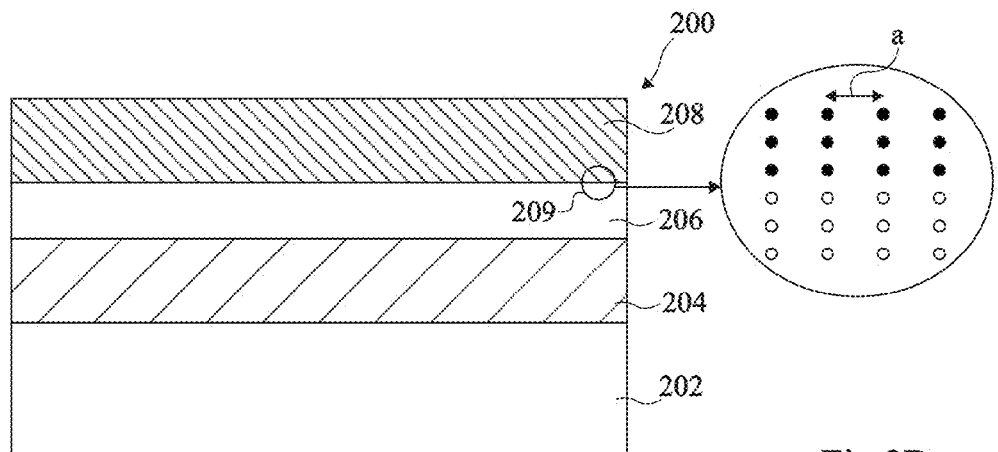

FIG. 2B illustrates the silicon structure 200 after a subsequent step in which a strained SiGe layer 208 is formed, by epitaxial growth, over the silicon layer 206. The thickness of the SiGe layer is, for example, chosen to be lower than the critical relaxation thickness as described in more detail for example in the publication entitled "Critical thickness for plastic relaxation of SiGe on Si(001) revisited", J. M. Hartmann et al., Journal of Applied Physics 110, 083529 (2011), and in the publication entitled "Strain relaxation kinetics in $Si_{1-x}Ge_x$/Si heterostructures", D. C. Houghton, Journal of Applied Physics 70, 2136 (1991), both publications being hereby incorporated by reference. For a concentration of Ge of 20%, the thickness of the SiGe layer is, for example, on the order of 50 nm. More generally, the thickness of the SiGe layer is, for example, in the range of 20 to 200 nm, as a function of the respective proportions of germanium and silicon. Remaining lower than the critical thickness leads to a good quality of the SiGe epitaxial layer.

In particular, the SiGe layer has more chance of growing without defects with the lattice parameter of the adjacent layer, in this case of silicon.

The concentration of germanium is for example in the range 10 to 50 percent, for example around 20 percent. Layer 208 is pseudomorphic, meaning that the inter-atomic distance at the interface with the underlying silicon layer 206 corresponds to that of the silicon atoms of layer 206. Indeed, the crystalline structure at a zone 209 at the interface between the silicon layer 206 and the SiGe layer 208 is represented in FIG. 2B, the SiGe atoms being represented by solid dots, and the silicon atoms by hollow dots. As illustrated, close to the interface with the silicon layer 206, the inter-atomic distance in the SiGe layer is equal to a, the same as that of the silicon atoms of layer 206. If remaining below the critical thickness, this inter-atomic distance is conserved for the whole thickness of the SiGe epitaxial layer.

Figure 2C:
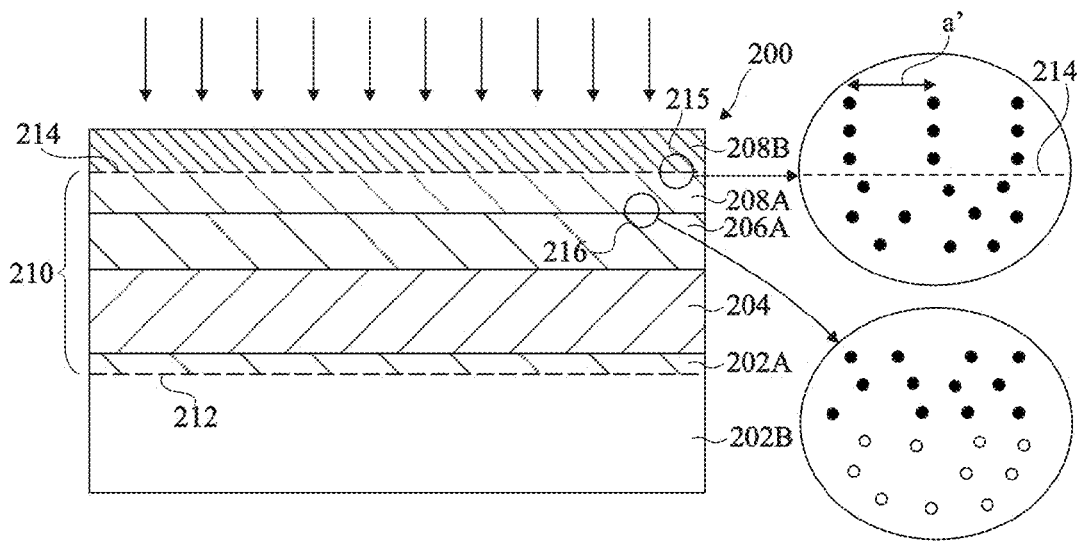

FIG. 2C illustrates the structure 200 during a subsequent step, in which atoms are implanted to amorphize the silicon layer 206, and also a lower portion 208A of the SiGe layer 208. A surface portion 208B of the SiGe layer is not amorphized, and thus remains crystalline. The surface portion 208B for example has a thickness of at least 1 nm. Due to the amorphization of the adjacent layers, this superficial portion relaxes to some extent and partially returns to its natural lattice parameter. The inter-atomic distance in this relaxed layer is thus at a', which is different from the inter-atomic distance a in the relaxed silicon.

In the example of FIG. 2C, a zone labeled 210 is amorphized by the implantation. The zone 210 extends down to a depth shown by dashed line 212, which falls within the silicon substrate 202. Thus an upper portion 202A of the silicon substrate 202 is also amorphized. In alternative embodiments, the limit 212 of the implantation could fall within the oxide layer 204, in other words the thickness of the amorphized layer 202A will be zero, i.e. there will be no amorphorization of the substrate 202.

The upper boundary of the zone 210 is shown by a dashed line 214. The crystalline structure in a zone 215 at the upper boundary 210 is represented in FIG. 2C, and shows that above this boundary, the SiGe layer, for example, has a crystalline structure with the inter-atomic distance equal to a', corresponding to the relaxed state of the SiGe. Below the boundary 210, the atoms are distributed irregularly, in accordance with the amorphous state.

The atomic structure in a zone 216 at the interface of the amorphous SiGe layer 208A and the amorphous silicon layer 206A is also represented in FIG. 2C, and shows that at this interface both the overlying SiGe atoms and the underlying silicon atoms are, for example, randomly distributed in accordance with the amorphous state.

For example, the amorphization is achieved by ionic implantation of argon at an energy chosen as a function of the thicknesses of the silicon layer 206 and of the SiGe layer 208. The determination of this energy can be achieved by calculation methods known to those skilled in the art. In particular, the software application SRIM (Stopping and Range of Ions in Matter") could be used, its use being common in the field of implantation for defining implantation profiles. For a thickness of silicon 206 of 8 nm and of SiGe of 50 nm, the implantation energy is, for example, about 150 keV, and the implantation dose is, for example, of between $1 \times 10^{14}$ and $2 \times 10^{14}$ atoms/$cm^2$.

In alternative embodiments, other types of atoms or more generally particles could be used to amorphize the silicon and SiGe layers 206A, 208A, and the energy and dose will depend in particular on the thickness of the layers and the type of implanted particles.

Figure 2D:
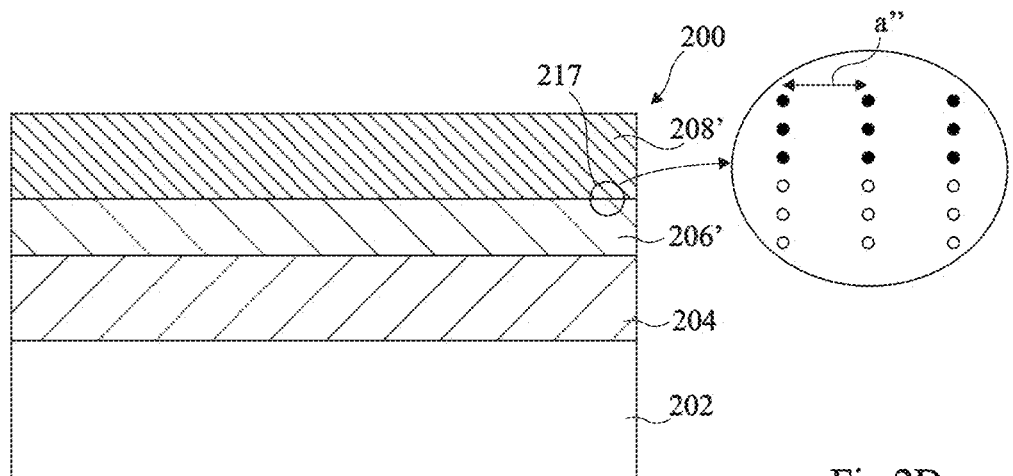

FIG. 2D illustrates the silicon structure after a subsequent step in which annealing is performed to further relax the surface portion 208B of the SiGe layer and then re-crystallize the amorphous lower portion 208A of the SiGe layer and the amorphous silicon layer 206A. In other words, the annealing results in a solid phase epitaxy (SPE). The surface portion 208B of the SiGe layer acts as the seed layer. To achieve this re-crystallization from the seed layer 208B of relaxed SiGe over the whole of the silicon layer 206A, the silicon layer 206A is for example advantageously crystallographically independent from the layer on which it rests. This is the case for example if the underlying layer is an amorphous layer, such as the oxide layer 204, although other types of amorphous layers could be used.

For example, annealing is performed at between 500 and 1100° C., and preferably at between 500 and 700° C., for example at around 550° C.

In order to encourage a relaxation of the surface portion 208B of the SiGe layer before recrystallization, in one embodiment, the annealing is a surface anneal performed using a laser or lamps, such as flash lamps, allowing superficial heating of the SiGe layer.

Alternatively or additionally, the annealing step comprises a first anneal at a relatively low temperature, for example at between 300 and 500° C., followed by a second anneal at a higher temperature of more than 500° C., and for example of between 500 and 1100° C. The first anneal is, for example, performed for a duration of between 30 seconds and several hours, and causes the insulating layer 204 to flow to at least some extent, thereby encouraging the relaxation of the surface portion 208B of the SiGe layer. For example, the first anneal is performed at a temperature of between 400 and 500° C. for a duration of between 30 seconds and 5 minutes, or a temperature of between 300° C. and 400° C. for a duration of between 5 minutes and several hours. The second anneal is, for example, performed for a duration of between 30 seconds and 10 minutes, and results in the re-crystallization of the amorphous SiGe layer 208A and of the amorphous silicon layer 206A.

The result of the annealing and re-crystallization steps is that the SiGe layer 208 becomes a relaxed layer 208', in which the inter-atomic distance a" corresponds to that of relaxed SiGe, and the silicon layer 206 becomes a strained layer 206', having the same inter-atomic distance as the SiGe layer 208'. The atomic structure in a zone 217 at the interface between the SiGe layer 208' and the silicon layer 206' is represented in FIG. 2D, and shows the SiGe atoms and the silicon atoms both having inter-atomic distances of a", corresponding to that of the SiGe layer 208 in the relaxed state.

For example, the resulting stressed silicon layer 206' has a compressive or tensile stress level of at least 800 MPa and a maximum dislocation density of $10^4/cm^2$.

Furthermore, despite the amorphization of the upper portion 202A of the silicon layer 202 (see FIG. 2C), the annealing step also re-crystallizes this portion. Thus even if the implantation step overshoots the oxide layer 204, the silicon substrate 202 reverts to a crystalline structure.

The structure 200 of FIG. 2D, with the layer 208' of relaxed SiGe, can be used as a substrate for epitaxial growth of another layer of strained silicon or any other material presenting a lattice compatible with SiGe.

Alternatively, further processing steps may be performed, as will now be described with reference to FIGS. 2E and 3.

Figure 2E:
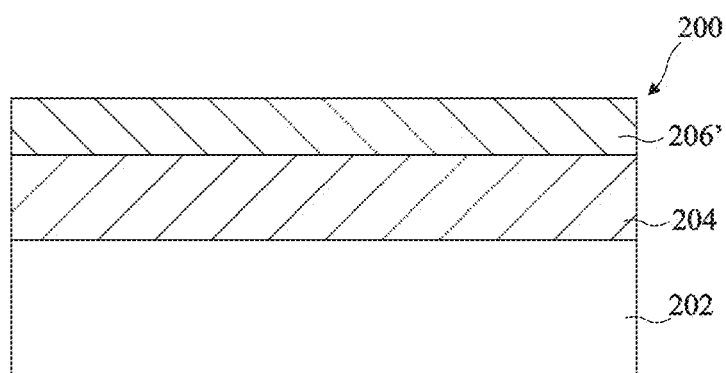

FIG. 2E illustrates the silicon structure 200 after a subsequent step in which the SiGe layer 208' is removed, for example by CMP and/or SiGe etching. The result is an SOI structure, comprising the strained silicon layer 206' over the oxide layer 204 and the silicon substrate 202.

Figure 3:
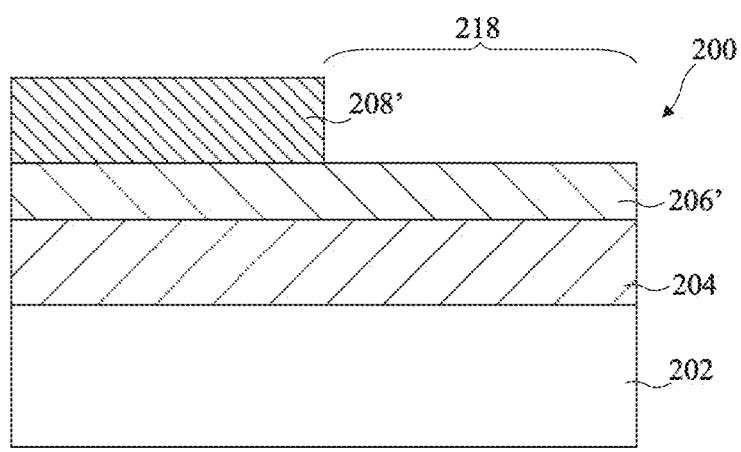
FIG. 3 illustrates a silicon structure according to an example embodiment of the present disclosure.

FIG. 3 is a cross-section view of the silicon structure 200 after an alternative step to that of FIG. 2E. In particular, rather than removing the entire SiGe layer 208', it is only partially removed by SiGe etching in a region 218, to expose the underlying strained silicon layer 206'.

In the structure 200 of FIG. 3, high performance p-channel MOS transistors are, for example, formed in the remaining portion of the SiGe layer 208', while high performance n-channel MOS transistors are, for example, formed in the strained silicon layer 206'.

In some embodiments, during the implantation step a mask is used such that the implantation in the Si and SiGe layers 206, 208 is localized. In this way, the Si layer 206 can be strained in some areas and unstrained in other areas.

An advantage of the embodiments described herein is that a strained silicon layer may be formed without relying on epitaxial growth over a SiGe layer. Instead, the silicon layer is strained by a re-crystallization step based on a SiGe seed layer, resulting in a particularly high quality strained silicon layer with a very low density of defects. Furthermore, the process is particularly simple and low cost, and does not involve a molecular bonding step of after the formation of the strained silicon layer.

Advantageously, the SiGe layer is formed as a strained layer, which is subsequently relaxed by the implantation and annealing steps. This leads to crystallized SiGe and Si layers with very few defects.

Having thus described at least one illustrative embodiment, various alterations, modifications and improvements will readily occur to those skilled in the art.

For example, it will be apparent to those skilled in the art that while an example embodiment is described in which the method starts with an SOI structure with an oxide layer 204 formed over a silicon substrate 202, the method could be applied to silicon layers formed on other insulators and substrates.

Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method comprising:
   forming a strained silicon germanium layer by epitaxial growth over a silicon layer disposed on a substrate;
   implanting atoms to amorphize said silicon layer and a lower portion of the strained silicon germanium layer, without amorphizing a surface portion of said strained silicon germanium layer; and
   annealing, to at least partially relax the strained silicon germanium layer and to re-crystallize said amorphized lower portion of the strained silicon germanium layer and said amorphized silicon layer, so that the silicon layer becomes a strained silicon layer.

2. The method of claim 1, wherein the silicon layer is formed over an amorphous layer disposed on the substrate.

3. The method of claim 2, wherein during said implantation step, atoms are implanted to a maximum depth falling within said amorphous layer or within said substrate.

4. The method of claim 1, wherein the implantation of atoms during said implantation step is localized using a mask.

5. The method of claim 1, wherein said strained silicon germanium layer has a thickness of between 20 and 200 nm.

6. The method of claim 5, wherein the strained silicon germanium layer has a thickness lower than the critical thickness below which SiGe grows, without defect, with the lattice parameter of the underlying silicon layer.

7. The method of claim 1, wherein said strained silicon germanium layer has a germanium concentration of between 10 and 50 percent.

8. The method of claim 1, wherein said surface portion has a thickness of at least 1 nm.

9. The method of claim 1, wherein said annealing is performed at a temperature of between 500 and 1100° C.

10. The method of claim 1, wherein said annealing comprises a first anneal of between 300 and 500° C. followed by a second anneal at a temperature greater than 500° C.

11. The method of claim 1, wherein said annealing comprises laser or lamp annealing to superficially heat said strained silicon germanium layer.

12. The method of claim 1, further comprising, after said annealing step, etching to at least partially remove said strained silicon germanium layer.

13. The method of claim 1, further comprising the epitaxial growth of another layer on the strained silicon germanium layer.

14. A method comprising:

forming a strained silicon germanium layer by epitaxial growth over a silicon layer disposed on a substrate;

without previously relaxing stress in the strained silicon germanium layer, implanting atoms to amorphize said silicon layer and a lower portion of the strained silicon germanium layer below a not amorphized surface portion of said strained silicon germanium layer; and annealing to at least partially relax the strained silicon germanium layer and to re-crystallize said amorphized lower portion of the strained silicon germanium layer and said amorphized silicon layer to make the silicon layer into a strained silicon layer.

* * * * *